(12) United States Patent  (10) Patent No.: US 8,892,242 B2
Kimura  (45) Date of Patent: Nov. 18, 2014

(54) ROBOT SYSTEM

(75) Inventor: Yoshiki Kimura, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 324 days.

(21) Appl. No.: 13/403,997

(22) Filed: Feb. 24, 2012

(65) Prior Publication Data

US 2012/0290124 A1 Nov. 15, 2012

(30) Foreign Application Priority Data

May 9, 2011 (JP) ................. 2011-104399

(51) Int. Cl.
  *G06F 7/00* (2006.01)
  *H01L 21/67* (2006.01)
(52) U.S. Cl.
  CPC .............................. *H01L 21/67265* (2013.01)
  USPC .................. 700/218; 700/213; 414/796.4
(58) Field of Classification Search
  USPC ....................................................... 700/218
  See application file for complete search history.

(56) References Cited

U.S. PATENT DOCUMENTS

2005/0203664 A1* 9/2005 Schauer et al. ............... 700/213
2009/0010748 A1* 1/2009 Kamikawa et al. ........ 414/796.4

FOREIGN PATENT DOCUMENTS

| JP | 11-116045 | 4/1999 |
|----|-----------|--------|
| JP | 2003-092338 | 3/2003 |
| JP | 2007-148778 | 6/2007 |
| JP | 2008-147583 | 6/2008 |
| JP | 2010-219209 | 9/2010 |

OTHER PUBLICATIONS

Japanese Office Action for corresponding JP Application No. 2011-104399, May 28, 2013.

* cited by examiner

*Primary Examiner* — Gene Crawford
*Assistant Examiner* — Kyle Logan
(74) *Attorney, Agent, or Firm* — Mori & Ward, LLP

(57) ABSTRACT

A robot system includes a robot hand for transferring substrates stored within a storage unit in multiple stages along a vertical direction, and a position detecting unit for detecting storage positions of the substrates stored within the storage unit. The robot system further includes a clearance calculating unit for calculating a clearance between the adjoining substrates on the basis of the storage positions of the substrates detected by the position detecting unit, and an entry permission/prohibition determining unit for determining permission or prohibition of entry of the robot hand into a space between the substrates on the basis of the clearance calculated by the clearance calculating unit.

20 Claims, 8 Drawing Sheets

ROBOT SYSTEM

CROSS-REFERENCE TO RELATED APPLICATIONS

The present application claims priority under 35 U.S.C. §119 to Japanese Patent Application No. 2001-104399 filed on May 9, 2011. The contents of this application are incorporated herein by reference in their entirety.

BACKGROUND OF THE INVENTION

1. Field of the Invention

The present invention relates to a robot system for transferring a substrate.

2. Description of the Related Art

Conventionally, there is known a robot system for transferring a substrate such as a semiconductor wafer or a glass substrate (hereinafter referred to as "wafer") stored within a cassette to a specified place.

Also proposed is a robot system in which the positions of individual wafers stored within a cassette in multiple stages are sensed by a sensor to detect a jutting wafer or an obliquely-stored wafer (see, e.g., Japanese Patent Application Publication No. 2010-219209).

SUMMARY OF THE INVENTION

In accordance with an aspect of the present invention, there is provided a robot system, including: a robot hand for transferring substrates stored within a storage unit in multiple stages along a vertical direction; a position detecting unit for detecting storage positions of the substrates stored within the storage unit; a clearance calculating unit for calculating a clearance between the adjoining substrates on the basis of the storage positions of the substrates detected by the position detecting unit; and an entry permission/prohibition determining unit for determining permission or prohibition of entry of the robot hand into a space between the substrates on the basis of the clearance calculated by the clearance calculating unit.

In accordance with another aspect of the present invention, there is provided a robot controller for controlling a robot hand configured to transfer substrates stored within a storage unit in multiple stages along a vertical direction, including: a position detecting unit for detecting storage positions of the substrates stored within the storage unit; a clearance calculating unit for calculating a clearance between the adjoining substrates on the basis of the storage positions of the substrates detected by the position detecting unit; and an entry permission/prohibition determining unit for determining permission or prohibition of entry of the robot hand into a space between the substrates on the basis of the clearance calculated by the clearance calculating unit.

In accordance with a further aspect of the present invention, there is provided a robot control method for controlling a robot hand configured to transfer substrates stored within a storage unit in multiple stages along a vertical direction, including: a step of detecting storage positions of the substrates stored within the storage unit; a step of calculating a clearance between the adjoining substrates on the basis of the storage positions of the substrates detected in the storage position detecting step; and a step of determining permission or prohibition of entry of the robot hand into a space between the substrates on the basis of the clearance calculated in the clearance calculating step.

BRIEF DESCRIPTION OF THE DRAWINGS

The objects and features of the present invention will become apparent from the following description of preferred embodiments given in conjunction with the accompanying drawings.

DESCRIPTION OF THE EMBODIMENTS

A robot system in accordance with an embodiment of the present invention will now be described with reference to the accompanying drawings. The present invention is not limited to the embodiment described herein below.

Figure 1:
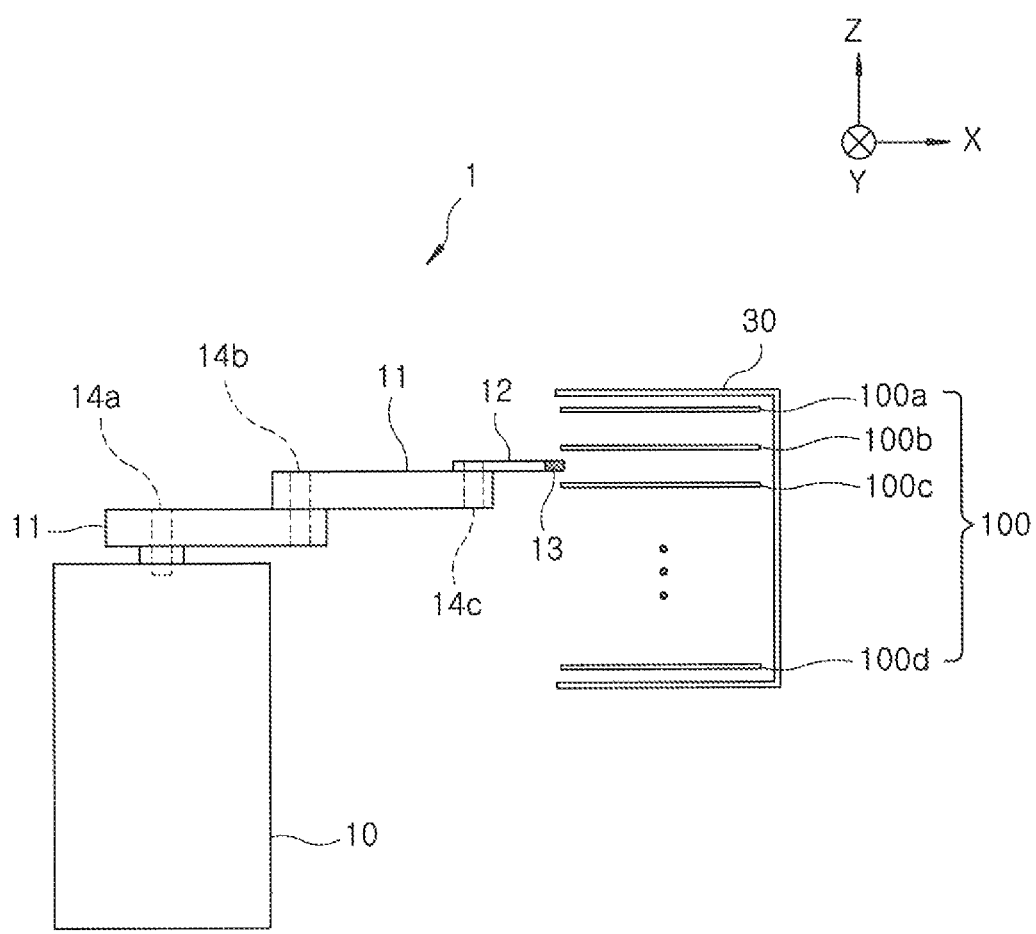
FIG. 1 is an explanatory view showing a robot system according to the present embodiment.

First, a robot system 1 according to the present embodiment will be described with reference to FIG. 1. FIG. 1 is an explanatory view showing the robot system 1 according to the present embodiment. For the sake of easier description, the shapes of some components are schematically shown in FIG. 1.

Figure 2:
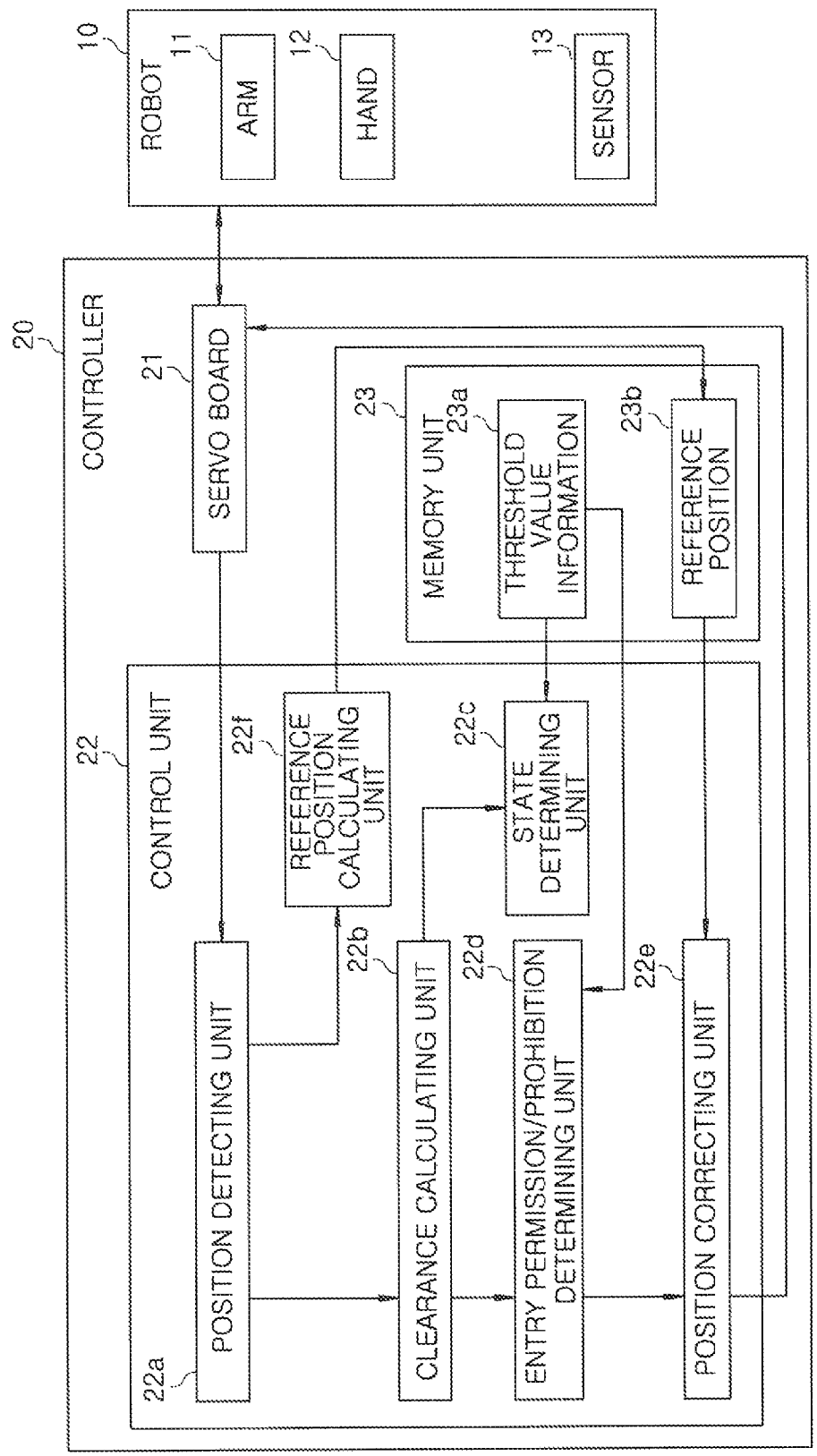
FIG. 2 is a block diagram of the robot system according to the present embodiment.

Referring to FIG. 1, the robot system 1 according to the present embodiment includes a robot 10 and a controller (see FIG. 2). The robot 10 includes an arm unit formed of a plurality of arms 11. A hand 12 is provided in the tip end portion of the arm 11 positioned farthest from the robot 10. A sensor 13 is arranged in the tip end portion of the hand 12.

Each of the arms 11 is connected to another arm 11 or the hand 12 through joints 14a, 14b and 14c. The joints 14a, 14b and 14c are rotated by, e.g., servo motors, about the rotation axes extending in the Z-axis direction in FIG. 1, thereby rotating the respective arms 11.

The joint 14a is moved up and down by a motor (not shown) along the Z-axis direction in FIG. 1. As a result, the robot system 1 is capable of scanning the sensor 13 provided in the hand 12 toward the positive side and the negative side in the Z-axis direction.

The robot 10 can make communication with the controller 20. The robot 10 receives an operation command from the controller 20 and operates pursuant to the operation command thus received. Near the hand 12, there is installed a cassette 30 that stores wafers 100 in multiple stages at a regular interval along the Z-axis direction as shown in FIG. 1.

In the following description, the surfaces of the cassette 30 seen from the positive side and the negative side in the Y-axis direction in FIG. 1 will be referred to as "side surfaces" and the surface of the cassette 30 seen from the negative side in the X-axis direction will be referred to as "front surface". The cassette 30 is provided at the front surface side with an opening through which the wafers 100 are loaded and unloaded into and from the cassette 30.

In the robot system 1, when transferring one of the wafers 100 stored within the cassette 30, e.g., the wafer 100b, the hand 12 is moved through the opening toward the positive side in the X-axis direction to enter the space existing between the wafer 100b to be transferred and the wafer 100c positioned just below the wafer 100b. In this regard, the wafers 100 are meant to designate all the wafers 100a through 100d stored in different positions.

The robot system 1 causes the hand 12 thus entered to move toward the positive side in the Z-axis direction, whereby the wafer 100b to be transferred is placed on the upper surface of the hand 12. Thereafter, the robot system 1 causes the hand 12 to move toward the negative side in the X-axis direction, thereby unloading the wafer 100b through the opening of the cassette 30.

The wafers 100 are very thin and weak. Therefore, the wafers 100 may possibly be damaged even by a slight shock, e.g., if they make contact with each other or with the hand 12. For that reason, when transferring the wafers 100 stored within the cassette 30, it is necessary for the robot system 1 to move the hand 12 into the cassette 30 with no contact with the wafers 100 and then transfer the wafers 100.

In view of this, when moving the hand 12 into the cassette 30, there is a need for the robot system 1 to calculate a safe and accurate entering position. In this regard, the robot system 1 performs the processes set forth below.

First, the robot system 1 causes the arms 11 to move along the Z-axis, thereby performing a scan with the sensor 13. As a result, the sensor 13 detects (hereinafter referred to as "maps") the actual storage positions of all the wafers 100 stored within the cassette 30.

The robot system 1 calculates the space width (hereinafter referred to as "clearance") between the adjoining wafers 100 on the basis of the mapped storage positions and determines permission or prohibition of entry of the hand 12 on the basis of the clearance thus calculated.

More specifically, the robot system 1 determines that the entry of the hand 12 is permitted, if the clearance between the wafer to be transferred, e.g., the wafer 100b, and the wafer 100c positioned just below the wafer 100b is equal to or greater than a specified threshold value.

As for the wafer 100d stored in the lowermost stage, the robot system 1 determines that the entry of the hand 12 into below the wafer 100d is permitted, if the clearance between the wafer 100d and the wafer positioned just above the wafer 100d is equal to or smaller than the specified threshold value.

In respect of the entry-permitted wafers 100, the robot system 1 calculates the final entry positions of the hand 12 (hereinafter referred to as "teaching positions") on the basis of the mapped storage positions and controls the robot 10 on the basis of the entry positions thus calculated. Consequently, the robot system 1 can safely unload the wafers 100 stored within the cassette 30.

The robot system 1 calculates the final entry positions by calculating in advance the reference values of the storage positions of the wafers 100 (hereinafter referred to as "reference positions") as teaching positions and then correcting the calculated teaching positions on the basis of the mapped storage positions. The details of the process of correcting the reference positions will be described later with reference to FIG. 5.

The robot system 1 calculates the thickness of the wafers 100 on the basis of the mapped storage positions and determines the storage state on the basis of the thickness of the wafers 100 thus calculated.

More specifically, the robot system 1 determines the storage states of the wafers 100, e.g., whether the wafers 100 are obliquely stored in the cassette 30 with respect to the horizontal direction or whether the wafers 100 are overlappingly stored in the cassette 30.

The robot system 1 notifies an operator of the storage states of the wafers 100 stored in an abnormal state. This enables the operator to correct the storage states of the wafers 100. Thus the robot system 1 can safely unload the wafer 100 stored within the cassette 30.

In this manner, the robot system 1 according to the present embodiment determines permission or prohibition of entry of the hand 12 on the basis of the clearance just blow or just above the wafer 100 to be transferred. If it is determined that the entry of the hand 12 is permitted, the robot system 1 of the present embodiment calculates the entry positions of the hand 12 on the basis of the mapped storage positions.

As set forth above, the robot system 1 of the present embodiment performs the determination of permission or prohibition of entry and the calculation of the entry positions on the basis of the actually measured clearance. This makes it possible to safely unload the wafers 100 stored within the cassette 30.

Next, the configuration of the robot system 1 according to the present embodiment will be described with reference to FIG. 2. FIG. 2 is a block diagram of the robot system 1 according to the present embodiment. As shown in FIG. 2, the robot system 1 includes the robot 10 and the controller 20.

The robot 10 includes the arms 11, the hand 12 and the sensor 13. The controller 20 includes a servo board 21, a control unit 22 and a memory unit 23. The control unit 22 includes a position detecting unit 22a, a clearance calculating unit 22b, an entry permission/prohibition determining unit 22d, a position correcting unit 22e, a state determining unit 22c and a reference position calculating unit 22f. The memory unit 23 can store threshold value information 23a and reference positions 23b.

The robot 10 is connected to the controller 20 so that it can make communication with the controller 20. The robot 10 receives an operation command from the controller 20 and operates pursuant to the operation command thus received. Each of the arms 11 is connected to another arm 11 or the hand 12 through the joints 14a to 14c provided with motors (not shown).

The hand 12 transfers the wafer 100 by holding the wafer 100 thereon with the major surfaces of the wafer 100 extending in the horizontal direction. The sensor 13 is an instrument for sensing the peripheral edge of the wafer 100 stored within the cassette 30.

Figure 3:
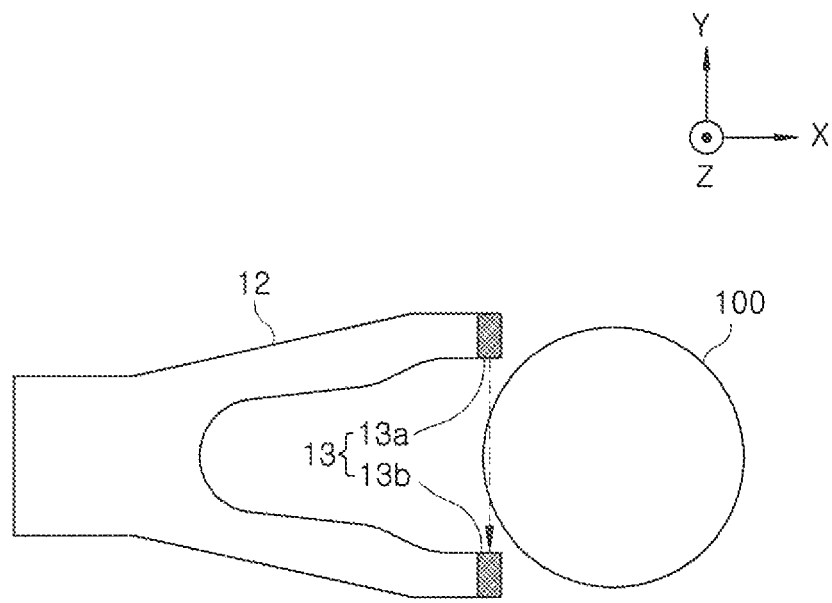
FIG. 3 is a plan view showing a hand and a sensor according to the present embodiment.

A method of sensing the wafer 100 with the sensor 13 will now be described with reference to FIG. 3. FIG. 3 is a plan view showing the hand 12 and the sensor 13 according to the present embodiment.

Referring to FIG. 3, the hand 12 has two tip end portions bifurcated into a Y-like shape. The sensor 13 includes a light-emitting unit 13a and a light-receiving unit 13b which are respectively provided in the tip end portions of the hand 12. The visible light, e.g., the red laser light, emitted from the light-emitting unit 13a is received by the light-receiving unit 13b.

The sensor 13 is moved in the Z-axis direction to scan the peripheral edge of the wafer 100. The light-receiving unit 13b detects interruption of the visible light emitted from the light-emitting unit 13a, thereby sensing the peripheral edge of the wafer 100 as shown in FIG. 3. Then the robot system 1 calculates the storage position of the wafer 100 on the basis of the Z-direction position of the wafer 100 when the light is interrupted.

The robot system 1 detects the thickness of the wafer 100 by measuring the distance between the Z-direction position where the visible light emitted from the light-emitting unit 13a begins to be interrupted by the wafer 100 and the Z-direction position where the visible light begins to be received again by the light-receiving unit 13b.

Likewise, the robot system 1 detects the clearance by measuring the distance between the Z-direction position where the visible light begins to be received by the light-receiving unit 13b and the Z-direction position where the visible light emitted from the light-emitting unit 13a begins to be interrupted by the wafer 100. In this manner, the robot system 1 calculates the thickness of the wafer 100 and the clearance between the adjoining wafers 100 on the basis of the positions detected by the sensor 13.

While FIG. 3 illustrates an example in which the light-emitting unit 13a and the light-receiving unit 13b are provided in the tip end portions of the hand 12, the light-emitting unit 13a and the light-receiving unit 13b may be provided in one of the tip end portions of the hand 12. In this case, the light-receiving unit 13b is arranged to receive the visible light emitted from the light-emitting unit 13a and then reflected by the wafer 100.

Referring back to FIG. 2, description will be continuously made on the configuration of the robot system 1. The controller 20 controls the operation of the robot 10. For example, the controller 20 performs a control for moving the arm 11 of the robot 10 depending on the teaching positions and a control for causing the hand 12 to enter the cassette 30 or retreat from the cassette 30.

The servo board 21 receives light reception information or light interruption information from the sensor 13 and position information from the respective motors. The servo board 21 outputs the received information to the position detecting unit 22a of the control unit 22. In addition, the servo board 21 receives position information and operation commands from the control unit 22 and outputs the position information and the operation commands to the robot 10.

The position detecting unit 22a is a processing unit that performs a process of mapping the wafers 100 stored within the cassette 30 on the basis of the light reception information and the light interruption information sent from the sensor 13 via the servo board 21 and the Z-direction position information sent from the Z-axis motor via the servo board 21. The position detecting unit 22a additionally performs a process of transmitting the storage positions of the wafers 100 to the clearance calculating unit 22b and the reference position calculating unit 22f.

The reference position calculating unit 22f is a processing unit that calculates the reference positions 23b on the basis of the storage positions of the wafers 100 sent from the position detecting unit 22a. With regard to the reference positions 23b, description will be described later.

The clearance calculating unit 22b is a processing unit that performs a process of first calculating the thickness of the wafers 100 on the basis of the storage positions of the wafers 100 sent from the position detecting unit 22a and then transmitting the calculated thickness of the wafers 100 to the state determining unit 22c.

The clearance calculating unit 22b additionally performs a process of calculating the clearance between the adjoining wafers 100 on the basis of the storage positions of the wafers 100 and transmitting the calculated clearance to the entry permission/prohibition determining unit 22d, after the process of determining the storage states of the wafers 100 performed by the state determining unit 22c comes to an end.

The state determining unit 22c is a processing unit that performs a process of determining the storage states of the wafers 100 on the basis of the thickness of the wafers 100 sent from the clearance calculating unit 22b.

The state determining unit 22c additionally performs a process of notifying a display (not shown) or the like of the determined storage states if the storage states of the wafers 100 are abnormal. This enables an operator to correct the storage states of the wafers 100. The state determining unit 22c also determines whether the wafers 100 are stored within the slots on the basis of the thickness of the wafers 100.

The entry permission/prohibition determining unit 22d determines permission or prohibition of entry of the hand 12 on the basis of the clearance between the adjoining wafers 100 sent from the clearance calculating unit 22b and the threshold value information 23a. The entry permission/prohibition determining unit 22d additionally performs a process of transmitting the determination result thereof to the position correcting unit 22e.

Figure 4A:
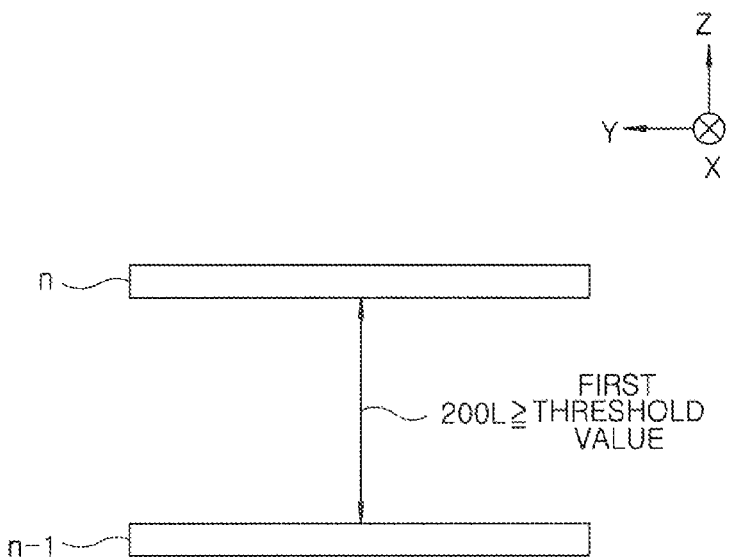
FIG. 4A is a first explanatory view illustrating an entry permission/prohibition determining process.
Figure 4B:
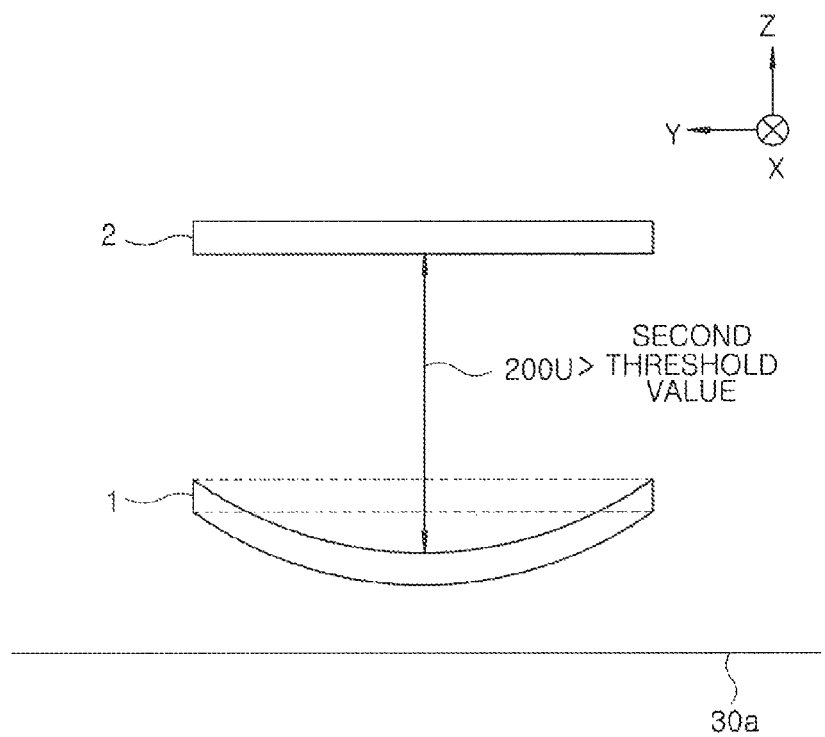
FIG. 4B is a second explanatory view illustrating the entry permission/prohibition determining process.

Details of the entry permission/prohibition determining process performed by the entry permission/prohibition determining unit 22d will now be described with reference to FIGS. 4A and 4B. FIG. 4A illustrates the entry permission/prohibition determining process in case of making determination that the entry is permitted. FIG. 4B illustrates the entry permission/prohibition determining process in case of making determination that the entry is prohibited.

FIG. 4A is a view seen from the front side (the opening side) of the cassette 30. It is assumed that the wafers 100 are stored in the (n−1)-th and n-th positions (hereinafter referred to as "slots").

If a wafer exists just below the wafer 100 to be transferred, e.g., if the wafer 100 in the n-th slot is transferred, the entry permission/prohibition determining unit 22d determines whether the hand 12 is permitted to enter the space between the wafer 100 in the n-th slot and the wafer 100 in the (n−1)-th slot. This determination is made as follows.

As illustrated in FIG. 4A, the entry permission/prohibition determining unit 22d determines permission or prohibition of entry of the hand 12 on the basis of the clearance 200L between the wafer 100 to be transferred and the wafer 100 existing just blow the wafer 100 to be transferred.

More specifically, as illustrated in FIG. 4A, the entry permission/prohibition determining unit 22d determines that the entry is permitted, if the clearance 200L is equal to or greater than a specified threshold value (a first threshold value). The clearance 200L refers to the space width between the lower surface of the wafer 100 to be transferred and the upper surface of the wafer 100 existing just blow the wafer 100 to be transferred.

Next, description will be made on a case where no wafer exists just blow the wafer 100 to be transferred, for example, a case where the wafer 100 to be transferred is positioned in the lowermost slot (the first slot). In the following description, it is assumed that the wafer 1 in the first slot is bent as illustrated in FIG. 4B. FIG. 4B is a view seen from the front side (the opening side) of the cassette 30.

As shown in FIG. 4B, if the wafer 1 in the first slot gets bent, the space between the wafer 1 in the first slot and the bottom surface 30a of the cassette 30 grows narrower as compared with a case where a normal wafer indicated by a broken line is stored in the first slot. Thus the clearance 200U between the wafer 1 in the first slot and the wafer 2 in the second slot becomes greater than a specified threshold value (a second threshold value).

Accordingly, the entry permission/prohibition determining unit 22d determines that the entry of the hand 12 is prohibited, if the clearance 200U above the wafer 1 in the first slot is greater than the second threshold value.

As described above, the entry permission/prohibition determining unit 22d determines permission or prohibition of entry of the hand 12 on the basis of the clearance between the wafer 100 to be transferred and the wafer 100 existing just below wafer 100 to be transferred or the clearance between the wafer 100 to be transferred and the wafer 100 existing just above the wafer 100 to be transferred and the threshold value information 23a.

Referring back to FIG. 2, description will be continuously made on the configuration of the robot system 1. The position correcting unit 22e is a processing unit that, if the determination result sent from the entry permission/prohibition determining unit 22d indicates permission of entry of the hand 12, performs a process of correcting the reference positions 23b calculated in advance by the reference position calculating unit 22f on the basis of the mapped storage positions.

The position correcting unit 22e additionally performs a process of notifying the robot 10 of the corrected teaching positions. Details of the process of correcting the reference positions 23b will be described later with reference to FIG. 5.

The memory unit 23 is formed of a memory device such as a non-volatile memory or a hard disc drive. The threshold value information 23a refers to individual threshold values which are used for comparison purposes when determination is made in the entry permission/prohibition determining unit 22d and the state determining unit 22c.

The reference positions 23b refer to storage position information of the reference wafers 100 calculated in advance at a specified timing. The storage positions of a plurality of reference wafers, e.g., the lowermost wafer 100 and the uppermost wafer 100, are detected by the sensor 13. The distance between the storage positions thus detected is equally divided into a number of wafer storing positions which are used as the reference positions 23b of the respective wafers 100. Alternatively, the reference position 23b may be decided on the basis of the storage positions of a plurality of arbitrary wafers 100 detected by the sensor 13. The reference wafers 100 may be some of the wafers 100 to be transferred at the present time or some of the wafers 100 stored within a cassette 30 having the same standard. The reference position 23b may be transmitted to the controller 20 from the outside, in which case the control unit 22 may not include the reference position calculating unit 22f.

Since the storage positions of the wafers 100 differ from cassette to cassette, the specified timing may refer to the time when a cassette 30 having another shape is installed or the time when wafers 100 having another shape or thickness are stored within the cassette 30. The reference position 23b may be stored as fixed values on the basis of the values calculated in advance.

Figure 5:
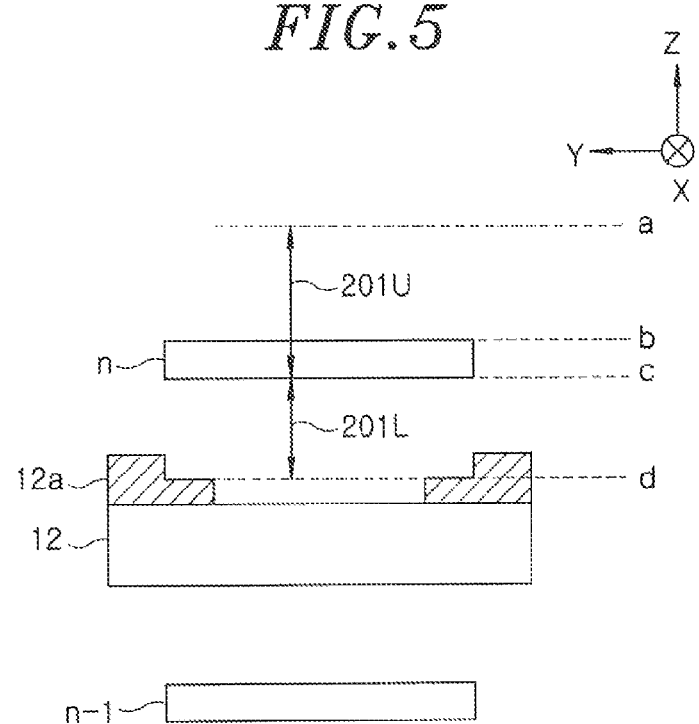
FIG. 5 is an explanatory view illustrating a reference position correcting process.

Next, one specific example of the process of correcting the reference position 23b performed by the position correcting unit 22e shown in FIG. 2 will be described with reference to FIG. 5. FIG. 5 is an explanatory view illustrating the process of correcting the reference position 23b.

FIG. 5 is a view seen from the front side (the opening side) of the cassette 30, illustrating a case where the hand 12 enters the space between the wafer 100 in the n-th slot, which is to be transferred, and the wafer 100 in the (n−1)-th slot, which is positioned just below the wafer 100 in the n-th slot.

A pad 12a is provided on the upper surface of the hand 12. The wafer 100 to be transferred is placed on the upper surface of the pad 12a. The position correcting unit 22e performs the following correcting process with respect to the respective wafers 100 and decides the teaching positions to be notified to the robot 10.

If the reference position 23b is the Z-direction position of the upper surface of the wafer 100 shown in FIG. 5, the difference between the actual position b of the upper surface of the wafer 100 in the n-th slot detected by the sensor 13 and the reference position 23b becomes a correction amount, which is represented by the following equation (1):

$$\text{correction amount} = \text{position of wafer 100} - \text{reference position 23}b \quad (1)$$

The reference position 23b may be the central position (in the Z-direction) between the upper surface and the lower surface of the wafer 100 or the position (in the Z-direction) of the lower surface of the wafer 100.

The Z-direction position c of the center of the lower surface of the wafer 100 in the n-th slot (namely, the position of the lower surface of the wafer 100 in the n-th slot existing in the calculate storage position) is assumed to be a registered position. The Z-direction displacement of the hand 12 positioned below the wafer 100 to be transferred (namely, the distance between the position of the wafer support surface of the hand 12 and the registered position at the time when the hand 12 enters the cassette 30) is assumed to be a lower offset 201L. The Z-direction displacement of the wafer 100 to be moved upward by the hand (namely, the distance between the position of the wafer support surface of the hand 12 and the registered position at the time when the hand 12 retreats from the cassette 30) is assumed to be an upper offset 201U.

Under this assumption, the Z-direction entry position d and the Z-direction retreat position a of the hand 12 are respectively represented by the following equations (2) and (3):

$$\text{entry position } d = (\text{registered position} - 201L) + \text{correction amount} \quad (2)$$

$$\text{retreat position } a = (\text{registered position} + 201U) + \text{correction amount} \quad (3)$$

In this manner, the position correcting unit 22e calculates the correction amount on the basis of the reference position 23b and the mapped actual measurement value and calculates the entry position and the retreat position on the basis of the correction amount. Then the position correcting unit 22e notifies the robot 10 of the entry position and the retreat position thus calculated.

Thus the robot 10 can safely unload the wafers 100 stored within the cassette 30 in multiple stages. While the process of correcting the entry position and the retreat position in the Z-direction performed by the position correcting unit 22e has been described above, a similar correcting process may be performed with respect to the X-direction and the Y-direction on the basis of the mapped storage positions.

The correction amount represented by the equation (1) may be stored in a CMOS (Complementary Metal Oxide Semiconductor) memory. In this case, even if the power of the controller 20 is off, the correcting process can be performed without having to conduct mapping again.

Next, the process of determining the storage states of the wafers 100 performed by the state determining unit 22c will be described with reference to FIG. 6.

Figure 6:
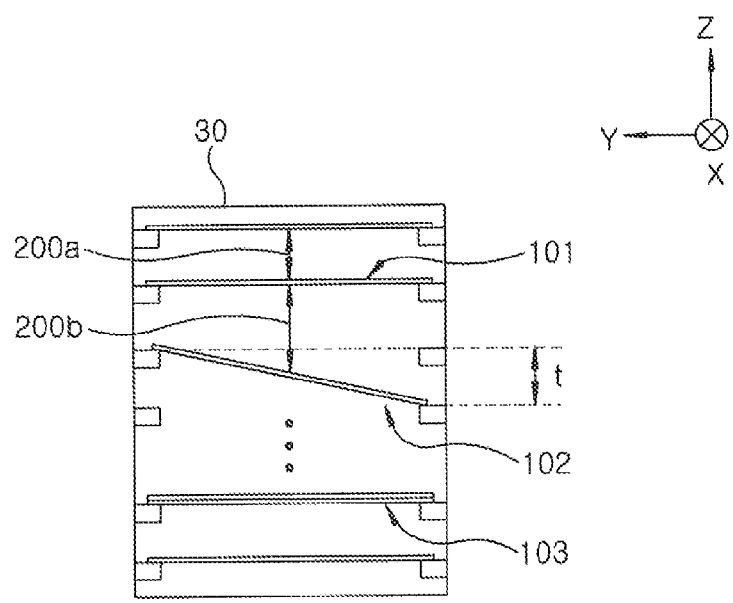
FIG. 6 is an explanatory view illustrating a state determining process.

FIG. 6 is a view seen from the front side (the opening side) of the cassette 30. On the inner surfaces of the side walls of the cassette 30, there are provided rack members for supporting the left and right edge portions of the wafers 100. The number of the rack members corresponds to the number of the wafers that can be stored within the cassette 30 at a regular interval along the Z-axis in FIG. 6.

Shown in FIG. 6 are a normally stored wafer 101, an obliquely stored wafer 102 and a plurality of overlappingly stored wafers 103.

As shown in FIG. 6, the normally stored wafer 101 has a small thickness. However, the thickness of the obliquely stored wafer 102 becomes equal to t. If the thickness of the wafer sent from the clearance calculating unit 22b is equal to or greater than a specified threshold value, the state determining unit 22c determines that the storage state of the wafer is oblique. Since the thickness t of the wafer 102 is equal to or greater than the specified threshold value in the illustrated example, the state determining unit 22c determines that the storage state of the wafer is oblique.

Alternatively, the state determining unit 22c may determine that the storage state of the wafer is oblique, if the difference between the mapped storage position of the wafer 100 and the reference position 23b is equal to or greater than a specified threshold value.

In the event that a plurality of wafers is stored in an overlapping state (just like the wafers 103 in the illustrated example), the thickness of the wafers 103 becomes equal to the total sum of the thickness of the overlapping wafers. Accordingly, the state determining unit 22c determines that the wafers are overlappingly stored, if the thickness of the wafers 103 sent from the clearance calculating unit 22b is equal to or greater than a specified threshold value.

The threshold value used in determining the oblique storage differs from the threshold value used in determining the overlapping storage. The respective threshold values may be set on the basis of the thickness of the wafers 100.

While the storage states of the wafers 100 are determined on the basis of the thickness of the wafers 100 in the illustrated example, the present invention is not limited thereto. For example, the storage states may be determined on the basis of the clearance between the wafers 100.

More specifically, if the wafers 100 are stored normally, the clearance between the adjoining wafers 100 becomes equal to 200a as illustrated in FIG. 6. However, if one of the wafers 100 is stored obliquely as shown in FIG. 6, the clearance becomes equal to 200b, thereby exceeding a specified clearance.

If the clearance between the adjoining wafers 100 sent from the clearance calculating unit 22b is equal to or greater than a specified threshold value, the state determining unit 22c determines that the storage state is oblique.

While the rack members for supporting the left and right edge portions of the wafers 100 are provided on the inner surfaces of the side walls of the cassette 30 in the example illustrated in FIG. 6, it may be possible to form grooves on the inner surfaces of the side walls of the cassette 30 and to have the edge portions of the wafers 100 held in the grooves.

Figure 7:
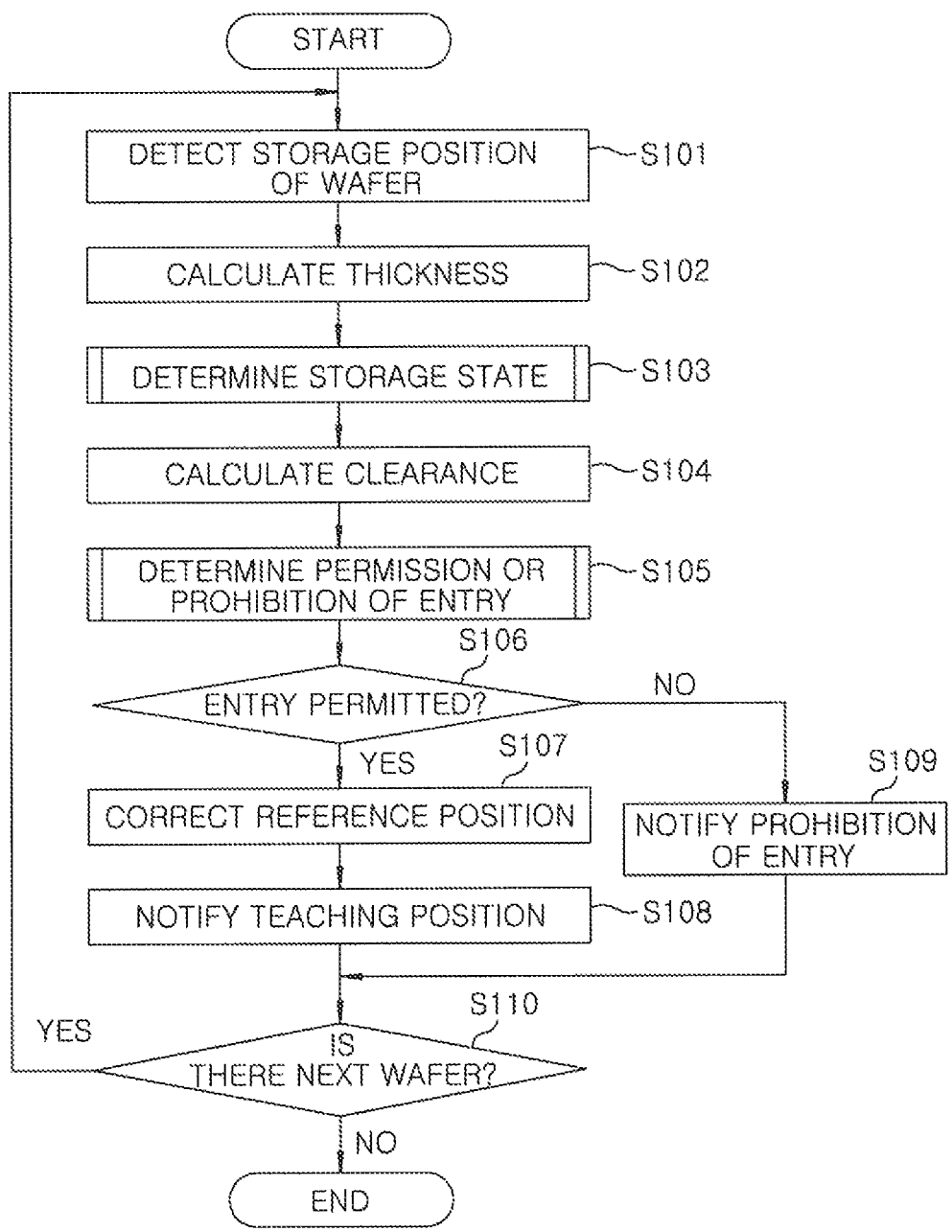
FIG. 7 is a flowchart showing the routine of a mapping process.
Figure 8:
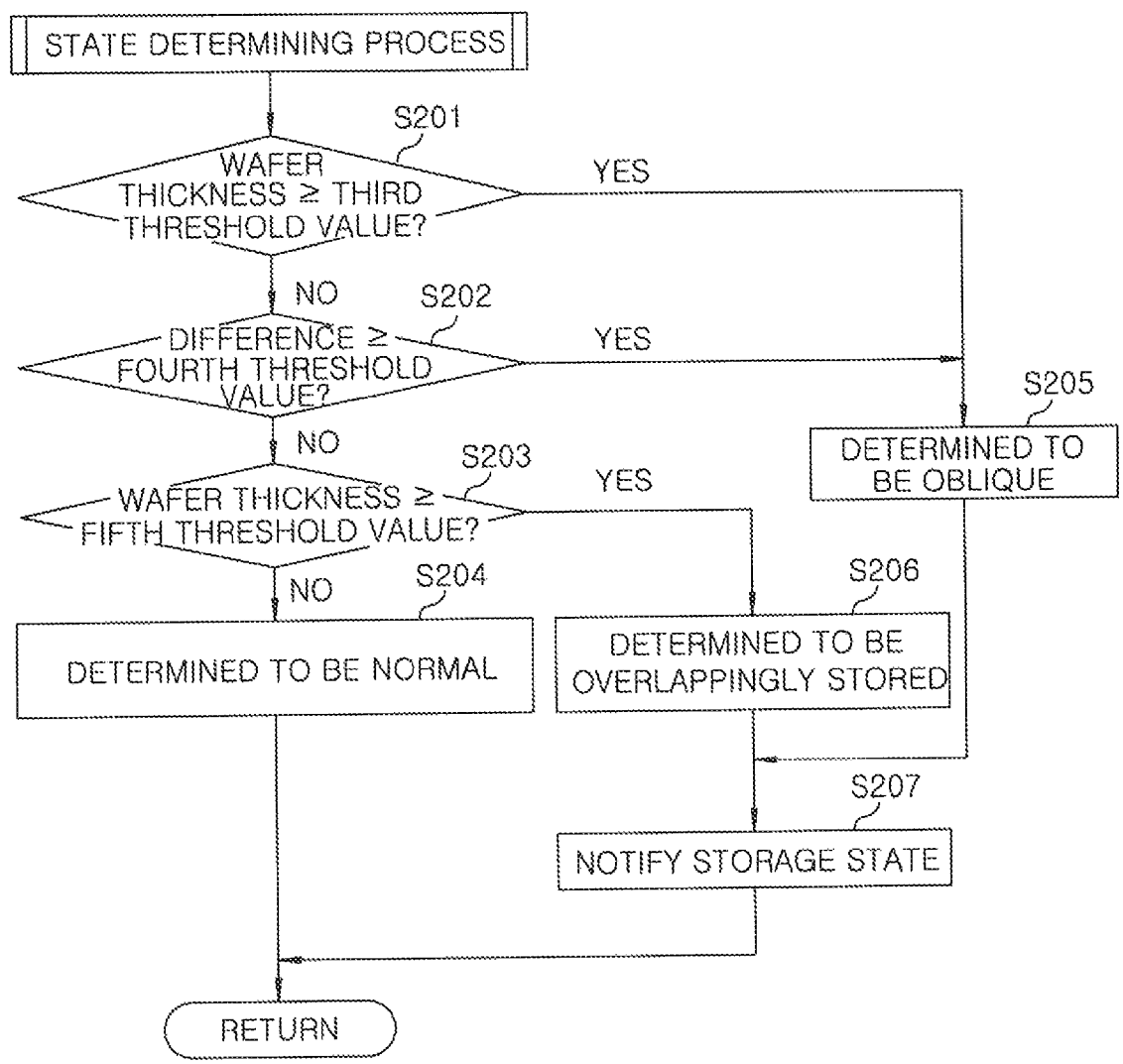
FIG. 8 is a flowchart showing the routine of a state determining process.
Figure 9:
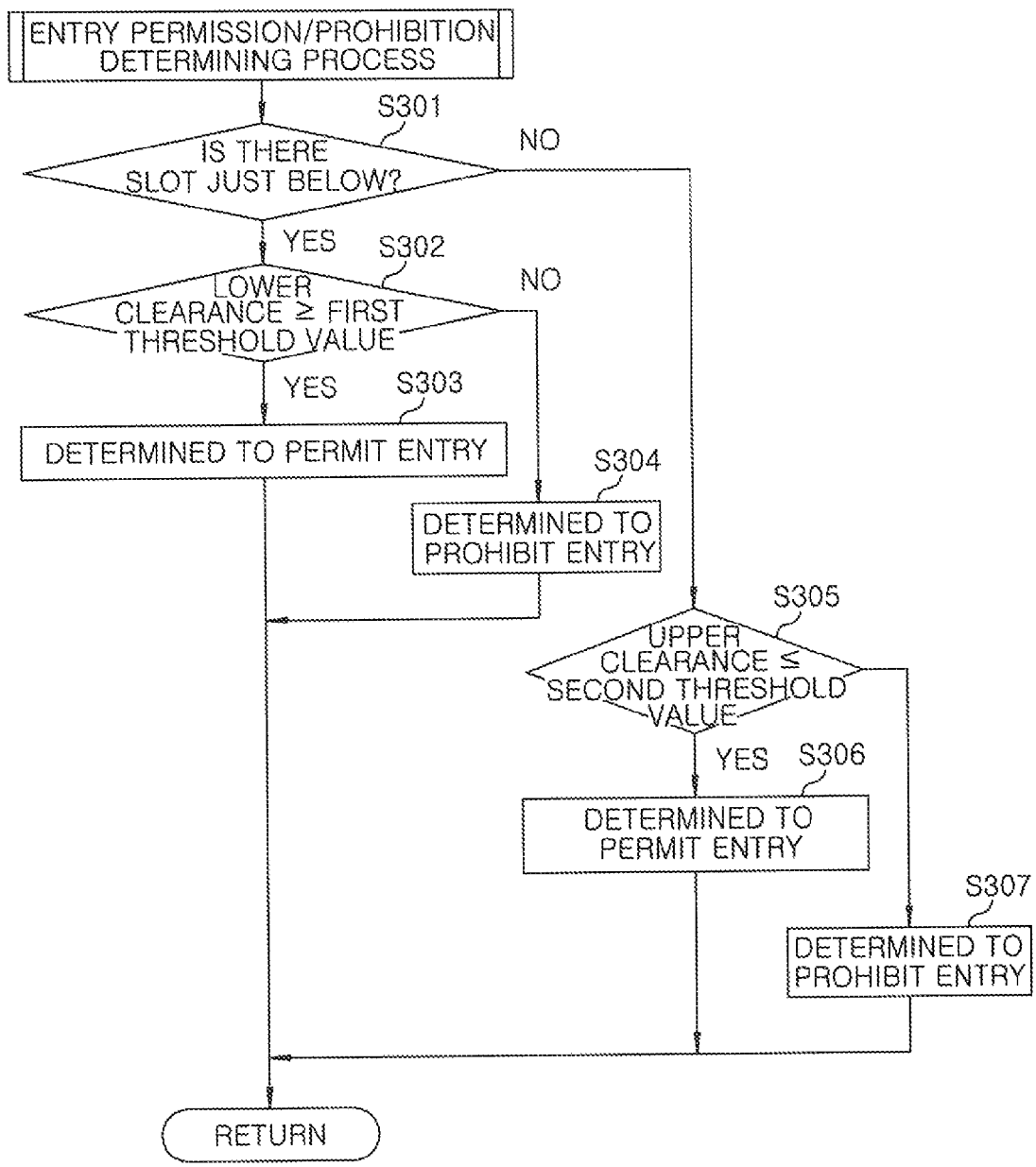
FIG. 9 is a flowchart showing the routine of an entry permission/prohibition determining process.

Next, the routine of the processes performed by the controller 20 shown in FIG. 2 will be described with reference to FIGS. 7 through 9. FIG. 7 is a flowchart showing the routine of the mapping process. FIG. 8 is a flowchart showing the routine of the state determining process. FIG. 9 is a flowchart showing the routine of the entry permission/prohibition determining process.

Referring first to FIG. 7, the position detecting unit 22a detects the storage positions of the wafers 100 by virtue of mapping (step S101). The clearance calculating unit 22b calculates the thickness of the wafers 100 on the basis of the storage positions of the wafers 100 sent from the position detecting unit 22a (step S102).

Then the state determining unit 22c performs the process of determining the storage states of the wafers 100 (step S103). The clearance calculating unit 22b calculates the clearance on the basis of the storage positions of the wafers 100 sent from the position detecting unit 22a (step S104).

Subsequently, the entry permission/prohibition determining unit 22d performs the process of determining permission or prohibition of entry of the hand 12 (step S105). If the entry permission/prohibition determining unit 22d determines that the entry of the hand 12 is permitted (if yes in step S106), the position correcting unit 22e performs the process of correcting the reference position 23b (step S107).

The position correcting unit 22e calculates the teaching positions (the entry position and the retreat position of the hand 12) on the basis of the correction amount obtained in step S107 and notifies the robot 10 of the teaching positions through the servo board 21 (step S108).

Thereafter, the control unit 22 determines whether the next wafer 100 exists or not (step S110). If the next wafer 100 exits (if yes in step S110), the flow proceeds to step S101. Then the processes of steps S101 through S108 are repeated. On the other hand, if the next wafer 100 does not exit (if no in step S110), a series of processing steps are ended.

If it is determined in step S106 that the entry of the hand 12 is prohibited (if no in step S106), the entry permission/prohibition determining unit 22d notifies an operator of the prohibition of entry (step S109). Then the flow proceeds to step S110.

Next, the routine of the state determining process performed by the state determining unit 22c will be described with reference to FIG. 8. As shown in FIG. 8, the state determining unit 22c determines whether the thickness of the wafer 100 is equal to or greater than a specified threshold value (a third threshold value) or not (step S201).

If the thickness of the wafer 100 is equal to or greater than the third threshold value (if yes in step S201), the state determining unit 22c determines that the wafer 100 is obliquely stored within the cassette 30 with respect to the horizontal direction (step S205).

If the thickness of the wafer 100 is smaller than the third threshold value (if no in step S201), the flow proceeds to step S202. Then the state determining unit 22c determines whether the difference between the storage position of the wafer 100 and the reference position 23b is equal to or greater than a specified threshold value (a fourth threshold value) or not (step S202).

If the difference between the storage position of the wafer 100 and the reference position 23b is equal to or greater than the fourth threshold value (if yes in step S202), the state determining unit 22c determines that the wafer 100 is obliquely stored within the cassette 30 with respect to the horizontal direction (step S205).

On the other hand, if the difference between the storage position of the wafer 100 and the reference position 23b is smaller than the fourth threshold value (if no in step S202), the flow proceeds to step S203. Then the state determining unit 22c determines whether the thickness of the wafer 100 is equal to or greater than a specified threshold value (a fifth threshold value) or not (step S203).

If the thickness of the wafer 100 is equal to or greater than the fifth threshold value (if yes in step S203), the state determining unit 22c determines that a plurality of wafers 100 is overlappingly stored in a slot within the cassette 30 (step S206).

If the thickness of the wafer 100 is smaller than the fifth threshold value (if no in step S203), the state determining unit 22c determines that the wafer 100 is normally stored within the cassette 30 (step S204). Then a series of processing steps are ended.

If it is determined that the wafer 100 is obliquely stored (step S205) or if it is determined that the wafers 100 are overlappingly stored (step S206), the state determining unit 22c notifies an operator of such a storage state (step S207). Then a series of processing steps are ended.

In the present embodiment described above, the state determining unit 22c determines that the wafer 100 is obliquely stored within the cassette 30, if the thickness of the wafer 100 is equal to or greater than the third threshold value (step S201) or if the difference between the storage position of the wafer 100 and the reference position 23b is equal to or greater than the fourth threshold value (step S202). Alternatively, only one of step S201 and step S202 may be performed in determining whether the wafer 100 is obliquely stored within the cassette 30.

Next, the routine of the entry permission/prohibition determining process performed by the entry permission/prohibition determining unit 22d will be described with reference to FIG. 9. Referring to FIG. 9, the entry permission/prohibition determining unit 22d determines whether a slot exists just below the wafer 100 to be transferred (namely, whether the wafer 100 to be transferred is positioned in the lowermost slot) (step S301).

If a slot exists just below the wafer 100 to be transferred and if a wafer 100 is positioned in the slot (if yes in step S301), the entry permission/prohibition determining unit 22d determines whether the clearance just below the wafer 100 to be transferred is equal to or greater than the first threshold value (step S302).

If the clearance just below the wafer 100 to be transferred is equal to or greater than the first threshold value (if yes in step S302) and if the wafer 100 is not positioned in the slot just below the wafer 100 to be transferred, the entry permission/prohibition determining unit 22d determines that the entry of the hand 12 is permitted to transfer the wafer 100 (step S303). Then a series of processing steps are ended.

If the clearance just below the wafer 100 to be transferred is smaller than the first threshold value (if no in step S302), the entry permission/prohibition determining unit 22d determines that the entry of the hand 12 is prohibited (step S304). Then a series of processing steps are ended.

If a slot does not exist just below the wafer 100 to be transferred (if no in step S301), the entry permission/prohibition determining unit 22d determines whether the clearance just above the wafer 100 to be transferred is equal to or smaller than the second threshold value (step S305).

If the clearance just above the wafer 100 to be transferred is equal to or smaller than the second threshold value (if yes in step S305), the entry permission/prohibition determining unit 22d determines that the entry of the hand 12 is permitted to transfer the wafer 100 (step S306). Then a series of processing steps are ended.

If a wafer 100 is positioned in the slot just above the wafer 100 to be transferred and if the clearance between the two wafers 100 is greater than the second threshold value (if no in step S305), the entry permission/prohibition determining unit 22d determines that the entry of the hand 12 is prohibited (step S307). Then a series of processing steps are ended. Even when a wafer 100 is not positioned in the slot just above the wafer 100 to be transferred, the entry permission/prohibition determining unit 22d determines that the entry of the hand 12 is prohibited, if the difference between the storage position of the wafer 100 to be transferred and the reference position 23b is equal to or greater than a specified threshold value (a sixth threshold value).

In the description made above, the state determining unit 22c notifies an operator of the storage state if the storage state of the wafer 100 is abnormal. However, when the entry permission/prohibition determining process is performed by the entry permission/prohibition determining unit 22d, the determination of permission or prohibition of entry of the hand 12 may be made depending on the storage state.

For example, if it is determined in the step prior to step S301 that the wafer 100 to be transferred is in an overlappingly stored state, the entry permission/prohibition determining unit 22d may proceed to step S307 and may determine that the entry of the hand 12 is prohibited. This makes it possible to prevent the overlappingly stored wafer 100 from being transferred in error.

In the present embodiment described above, the entry permission/prohibition determining unit 22d determines permission or prohibition of entry of the hand 12 on the basis of the clearance just below or just above the wafer 100 to be transferred. If the entry permission/prohibition determining unit 22d determines that the entry of the hand 12 is permitted, the position correcting unit 22e calculates the final entry position of the hand 12 on the basis of the mapped storage positions. The robot 10 is controlled pursuant to the entry position thus calculated.

In the robot system 1 according to the present embodiment, it is therefore possible to safely unload the wafers 100 stored within the cassette 30 in multiple stages.

In the embodiment described above, the sensor 13 for sensing the peripheral edges of the wafers 100 is provided in the tip end portions of the hand 12. The hand for transferring the wafers 100 may be formed independently of the hand 12 provided with the sensor 13 for sensing the peripheral edges of the wafers 100.

Different kinds of hands 12 may be provided in a single arm unit. For example, the hand for transferring the wafers 100 and the hand 12 provided with the sensor 13 may be attached to a single arm unit. The robot system 1 may be provided with a plurality of arm units, each of which has the hand for transferring the wafers 100 and the hand 12 provided with the sensor 13.

In the present embodiment, description has been made on a case where the permission or prohibition of entry of the hand 12 is determined by detecting the storage states of the wafers 100 in the Z-direction. Similarly, the permission or prohibition of entry of the hand 12 may be determined by detecting the storage states of the wafers 100 in the X-direction and the Y-direction.

In the present embodiment, the respective processes performed by the controller 20, such as the clearance calculating process, the entry permission/prohibition determining process, the position correcting process and the state determining process, may be performed by other devices (not shown) which are connected to the controller 20.

While one preferred embodiment of the present invention has been described above, the present invention is not limited to this embodiment but may be modified or changed in many different forms without departing from the scope of the invention defined in the claims.

What is claimed is:
1. A robot system, comprising:
   a robot hand for transferring substrates stored within a storage unit in multiple stages along a vertical direction;
   a position detecting unit for detecting storage positions of the substrates stored within the storage unit;

a clearance calculating unit for calculating a clearance between the adjoining substrates on the basis of the storage positions of the substrates detected by the position detecting unit; and an entry permission/prohibition determining unit for determining permission or prohibition of entry of the robot hand into a space existing right below a substrate to be transferred on the basis of the clearance calculated by the clearance calculating unit, wherein, when the substrate to be transferred is not stored in a lowermost stage of the storage unit, the entry permission/prohibition determining unit is configured to determine that the entry of the robot hand into the space is permitted if a clearance between a substrate to be transferred and a substrate existing right below the substrate to be transferred is equal to or greater than a first threshold value, and wherein, when the substrate to be transferred is stored in the lowermost stage of the storage unit, the entry permission/prohibition determining unit is configured to determine that the entry of the robot hand into the space is permitted if a clearance between the substrate to be transferred and a substrate existing right above the substrate to be transferred is equal to or less than a second threshold value.

2. The robot system of claim 1, further comprising:
a reference position calculating unit for calculating reference positions of the substrates stored within the storage unit on the basis of storage positions of reference substrates; and
a position correcting unit for correcting the reference positions calculated by the reference position calculating unit on the basis of the storage positions of the substrates detected by the position detecting unit.

3. The robot system of claim 1,
wherein the robot hand includes a sensor configured to sense the substrates stored within the storage unit, and
wherein the position detecting unit is configured to detect the storage positions of the substrates stored within the storage unit based on sensing results of the sensor.

4. The robot system of claim 1, further comprising:
a state determining unit for determining storage states of the substrates stored within the storage unit on the basis of the storage positions of the substrates detected by the position detecting unit, the entry permission/prohibition determining unit being configured to determine the permission or prohibition of the entry of the robot hand into the space existing right below the substrate to be transferred on the basis of the storage states of the substrates determined by the state determining unit.

5. The robot system of claim 4, wherein the state determining unit is configured to determine whether the substrates are obliquely stored with respect to a horizontal direction, depending on a thickness of the substrates calculated on the basis of the storage positions of the substrates detected by the position detecting unit.

6. The robot system of claim 4, further comprising:
a reference position calculating unit for calculating reference positions of the substrates stored within the storage unit on the basis of storage positions of reference substrates, the state determining unit being configured to determine whether the substrates are obliquely stored with respect to a horizontal direction, on the basis of the storage positions of the substrates detected by the position detecting unit and the reference positions calculated by the reference position calculating unit.

7. The robot system of claim 4, wherein the state determining unit is configured to determine whether the substrates are overlappingly stored, depending on a thickness of the substrates calculated on the basis of the storage positions of the substrates detected by the position detecting unit.

8. A robot controller for controlling a robot hand configured to transfer substrates stored within a storage unit in multiple stages along a vertical direction, comprising:
a position detecting unit for detecting storage positions of the substrates stored within the storage unit;
a clearance calculating unit for calculating a clearance between the adjoining substrates on the basis of the storage positions of the substrates detected by the position detecting unit; and
an entry permission/prohibition determining unit for determining permission or prohibition of entry of the robot hand into a space existing right below a substrate to be transferred on the basis of the clearance calculated by the clearance calculating unit,
wherein, when the substrate to be transferred is not stored in a lowermost stage of the storage unit, the entry permission/prohibition determining unit is configured to determine that the entry of the robot hand into the space is permitted if a clearance between a substrate to be transferred and a substrate existing right below the substrate to be transferred is equal to or greater than a first threshold value, and
wherein, when the substrate to be transferred is stored in the lowermost stage of the storage unit, the entry permission/prohibition determining unit is configured to determine that the entry of the robot hand into the space is permitted if a clearance between the substrate to be transferred and a substrate existing right above the substrate to be transferred is equal to or less than a second threshold value.

9. The robot controller of claim 8, further comprising:
a reference position calculating unit for calculating reference positions of the substrates stored within the storage unit on the basis of storage positions of reference substrates; and
a position correcting unit for correcting the reference positions calculated by the reference position calculating unit on the basis of the storage positions of the substrates detected by the position detecting unit.

10. The robot controller of claim 8, wherein the position detecting unit is configured to detect the storage positions of the substrate stored within the storage unit based on sensing results of a sensor included in the robot hand.

11. The robot controller of claim 8, further comprising:
a state determining unit for determining storage states of the substrates stored within the storage unit on the basis of the storage positions of the substrates detected by the position detecting unit, the entry permission/prohibition determining unit being configured to determine the permission or prohibition of the entry of the robot hand into the space existing right below the substrate to be transferred on the basis of the storage states of the substrates determined by the state determining unit.

12. The robot controller of claim 11, wherein the state determining unit is configured to determine whether the substrates are obliquely stored with respect to a horizontal direction, depending on a thickness of the substrates calculated on the basis of the storage positions of the substrates detected by the position detecting unit.

13. The robot controller of claim 11, further comprising:
a reference position calculating unit for calculating reference positions of the substrates stored within the storage unit on the basis of storage positions of reference substrates, the state determining unit configured to determine whether the substrates are obliquely stored with respect to a horizontal direction, on the basis of the storage positions of the substrates detected by the position detecting unit and the reference positions calculated by the reference position calculating unit.

14. The robot controller of claim 11, wherein the state determining unit is configured to determine whether the substrates are overlappingly stored, depending on a thickness of the substrates calculated on the basis of the storage positions of the substrates detected by the position detecting unit.

15. A robot control method for controlling a robot hand configured to transfer substrates stored within a storage unit in multiple stages along a vertical direction, comprising:
   detecting storage positions of the substrates stored within the storage unit;
   calculating a clearance between the adjoining substrates on the basis of the storage positions of the substrates detected in the storage position detecting; and
   determining permission or prohibition of entry of the robot hand into a space existing right below a substrate to be transferred on the basis of the clearance calculated in the clearance calculating,
   wherein, when the substrate to be transferred is not stored in a lowermost stage of the storage unit, the entry of the robot hand into the space is determined to be permitted if a clearance between a substrate to be transferred and a substrate existing right below the substrate to be transferred is equal to or greater than a first threshold value, and
   wherein, when the substrate to be transferred is stored in the lowermost stage of the storage unit, the entry of the robot hand into the space is determined to be permitted if a clearance between the substrate to be transferred and a substrate existing right above the substrate to be transferred is equal to or less than a second threshold value.

16. The robot control method of claim 15, further comprising:
   calculating reference positions of the substrates stored within the storage unit on the basis of storage positions of reference substrates; and
   correcting the reference positions calculated in the reference position calculating on the basis of the storage positions of the substrates detected in the storage position detecting.

17. The robot control method of claim 15,
   wherein the robot hand includes a sensor configured to perform sensing of the substrates stored within the storage unit, and
   wherein said detecting is performed based on sensing results of the sensor.

18. The robot control method of claim 15, further comprising:
   determining storage states of the substrates stored within the storage unit on the basis of the storage positions of the substrates detected in the storage position detecting, the entry permission or prohibition determining including determining the permission or prohibition of the entry of the robot hand into the space existing right below the substrate to be transferred on the basis of the storage states of the substrates determined in the storage state determining.

19. The robot control method of claim 18, wherein the storage state determining includes determining whether the substrates are obliquely stored with respect to a horizontal direction, depending on a thickness of the substrates calculated on the basis of the storage positions of the substrates detected in the storage position detecting.

20. The robot control method of claim 18, further comprising: calculating reference positions of the substrates stored within the storage unit on the basis of storage positions of reference substrates, the storage state determining including determining whether the substrates are obliquely stored with respect to a horizontal direction, depending on the storage positions of the substrates detected in the storage position detecting and the reference positions calculated in the reference position calculating.

* * * * *